(12) United States Patent
Wu et al.

(10) Patent No.: US 6,909,162 B2
(45) Date of Patent: Jun. 21, 2005

(54) SURFACE PASSIVATION TO REDUCE DARK CURRENT IN A CMOS IMAGE SENSOR

(75) Inventors: Chih-huei Wu, Sunnyvale, CA (US); Tiemin Zhao, Palo Alto, CA (US); Xinping He, San Jose, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 676 days.

(21) Appl. No.: 10/016,271

(22) Filed: Nov. 2, 2001

(65) Prior Publication Data

US 2003/0086011 A1 May 8, 2003

(51) Int. Cl.[7] .............................................. H01L 31/068
(52) U.S. Cl. ...................... 257/461; 257/462; 257/463
(58) Field of Search ................................. 257/461–463

(56) References Cited

U.S. PATENT DOCUMENTS

| | | | |
|---|---|---|---|
| 4,451,838 A | * | 5/1984 | Yamazaki ................... 136/258 |
| 4,581,622 A | * | 4/1986 | Takasaki et al. ......... 365/185.32 |
| 4,742,381 A | | 5/1988 | Fujii |
| 5,394,005 A | * | 2/1995 | Brown et al. ................ 257/461 |
| 6,171,889 B1 | | 1/2001 | Iwamatsu et al. |
| 6,232,626 B1 | * | 5/2001 | Rhodes ....................... 257/292 |
| 6,235,600 B1 | | 5/2001 | Chiang et al. |
| 6,271,054 B1 | | 8/2001 | Ballantine et al. |
| 6,339,248 B1 | | 1/2002 | Zhao et al. |
| 6,486,521 B2 | | 11/2002 | Zhao et al. |
| 6,531,405 B1 | * | 3/2003 | Wegleiter et al. ........... 438/745 |

FOREIGN PATENT DOCUMENTS

EP        1 102 322 A2      5/2001

* cited by examiner

*Primary Examiner*—Allan R. Wilson
(74) *Attorney, Agent, or Firm*—Perkins Coie LLP

(57) ABSTRACT

A method for reducing dark current in a photodiode is disclosed. The photodiode comprises a N-well formed in a P-substrate. The method comprises doping the surface of said N-well with a nitrogen dopant. Alternatively, an oxygen or silicon dopant may be used. Still alternatively, a silicon oxynitride layer may be formed over the N-well.

11 Claims, 4 Drawing Sheets

SURFACE PASSIVATION TO REDUCE DARK CURRENT IN A CMOS IMAGE SENSOR

TECHNICAL FIELD OF THE INVENTION

The present invention relates to image sensing devices, and more particularly, to a pixel cell having reduced dark current.

BACKGROUND OF THE INVENTION

Integrated circuit technology has revolutionized various fields, including computers, control systems, telecommunications, and imaging. For example, in the imaging field, active pixel CMOS image sensors have proved to be less expensive to manufacture relative to CCD imaging devices. Further, for certain applications CMOS devices are superior in performance. The pixel elements in a MOS device can be made smaller and therefore provide a higher resolution than CCD image sensors. In addition, the signal processing logic necessary can be integrated alongside the imaging circuitry, thus allowing for a single integrated chip to form a complete stand alone imaging device.

As noted in U.S. Pat. No. 5,625,210 to Lee et al. ("the '210 patent"), an active pixel sensor refers to an electronic image sensor with active devices, such as transistors, that are within each pixel. Conventional active pixel sensors typically employ photodiodes as the image sensing elements. The most popular active pixel sensor structure consists of three transistors and an N+/P-well photodiode, which is a structure that is compatible with the standard CMOS fabrication process. It is desirable for the active pixel to have high sensitivity, combined with a low dark current (i.e., the current that is output form the sensor in a dark environment). Excessive dark current lowers the dynamic range of the CMOS image sensor because there is insufficient ability to distinguish between light and dark conditions.

In the design of active pixel sensors, it is known that for the same sensor size, a deeper junction photodiode will have a higher sensitivity than that of a shallow junction (such as in a typical N+/P-well). However, the production of such devices usually requires modifications to the standard CMOS fabrication process, and in addition may increase dark current due to larger effective junction areas (when considered from a three-dimensional perspective).

Thus, two of the presently available alternatives are to either use the standard three-transistor plus N+/P-well photodiode structure that can be formed with the standard CMOS fabrication process, or else abandon the standard CMOS fabrication process in favor of designs that are intended to improve the sensitivity and dark current characteristics.

One active pixel sensor design that is not fabricated using the standard CMOS fabrication process is the pinned photodiode, as taught in the '210 patent. The pinned photodiode has gained favor for its ability to have good color response for blue light, as well as advantages in dark current density. Reduction in dark current is accomplished by pinning the diode surface potential to the P-well or P-substrate (GND) through a P+ region. An improvement to the '210 patent is shown in U.S. Pat. No. 5,880,495, assigned to the assignee of the present invention.

Nevertheless, the pinned photodiode configuration still has certain drawbacks. For example, in a pinned photodiode structure, there are four transistors, so the fill factor is smaller for the same area, which results in less sensitivity. In addition, the fabrication process for such a configuration requires significant modification form the standard CMOS fabrication prices, due to the buried channel transistor. The pinned photodiode configuration may cause image lag due to the incomplete transfer of charge from the diode to the floating node, if the junction profile is not perfectly optimized for the charge transfer.

Another approach compatible with standard CMOS processes is to use a hydrogen anneal process to reduce dark current by passivating dangling silicon bonds. For example, U.S. Pat. No. 6,271,054 discloses using such a method in the context of a CCD device. However, subsequent thermal processes inherent in CCD processes, due to the poor thermal stability of the silicon-hydrogen structure, may easily destroy the effect of hydrogen passivation.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION OF THE PREFERRED EMBODIMENT

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is an active pixel sensor that can be formed with the standard CMOS fabrication process, while also having the desirable characteristics of high sensitivity combined with a low dark current. Utilizing a thermal diffusion or implantation process to passivate the silicon surface reduces the dark current. The term surface as used herein refers to the topmost surface of a wafer. In the following description, one embodiment of an active pixel sensor is described. However, it must be appreciated that the inventive aspects can be applied to a wide variety of pixel structures. As will be seen, the important aspect of the present invention is the passivation by use of thermal diffusion or ion implantation of the silicon surface of the photodiode. Thus, the specific structures, steps, and order of steps shown below should not be construed as limiting.

Figure 1:
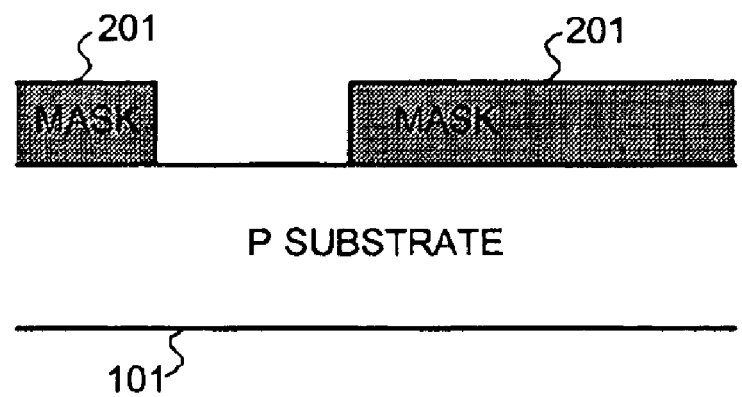
FIG. 1 is a P-substrate with a first mask to begin the formation of a pixel sensor according to the present invention.

In the description below, the preferred dopant for N-type implant is phosphorus, while the preferred dopant for a P-type implant is boron, though other well-known dopants may be used. The standard CMOS fabrication process may start with a P type semiconductor substrate, as illustrated in FIG. 1. As illustrated in FIG. 1, a P type semiconductor substrate 101 is initially covered with a photolithography mask 201. The photolithography mask 201 leaves a portion of the P-substrate 101 exposed, so that it may receive a first N type ion implant, as illustrated with respect to FIG. 2.

Figure 2:
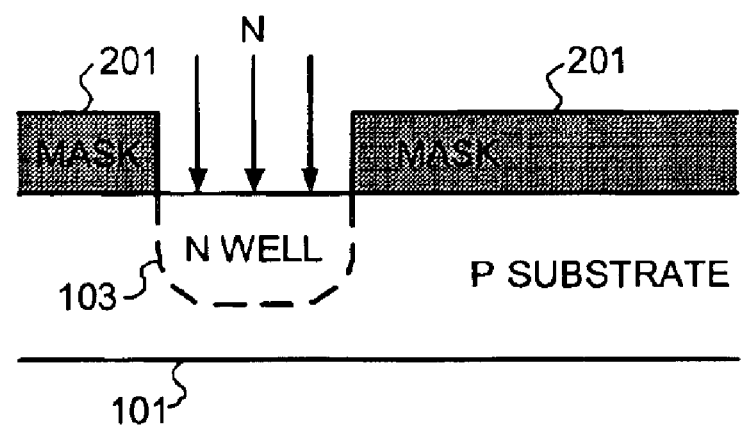
FIG. 2 shows the formation of an N-well in the P-substrate.

As illustrated in FIG. 2, a first type ion implant is performed to implant a deep N-well 103. The N-well 103 is formed fairly deep in the substrate, so as to increase the sensitivity of the photodiode. The increase in sensitivity is achieved because the deep implant yields substantial increases in the photo response, due to an increase collection path for the instant photo-generated carriers.

Figure 3:
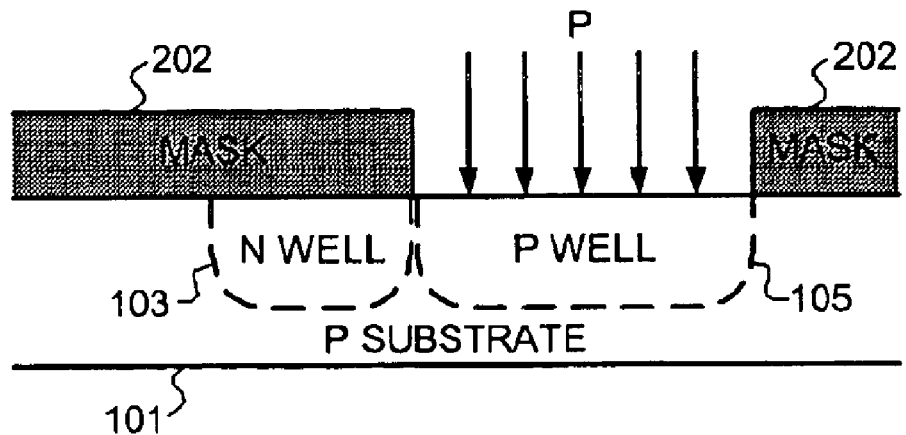
FIG. 3 shows the formation of a P-well in the P-substrate.

As illustrated in FIG. 3, a photolithography mask 202 is deposited onto a portion of the P-substrate. Thereafter, a P type ion implant is performed to create a deep P-well 105 adjacent to the N-well 103. As will be described in more detail below, the P-well is used in part for the formation of a reset transistor, as well as a buffer transistor 151 and a row select transistor 153.

Figure 4:
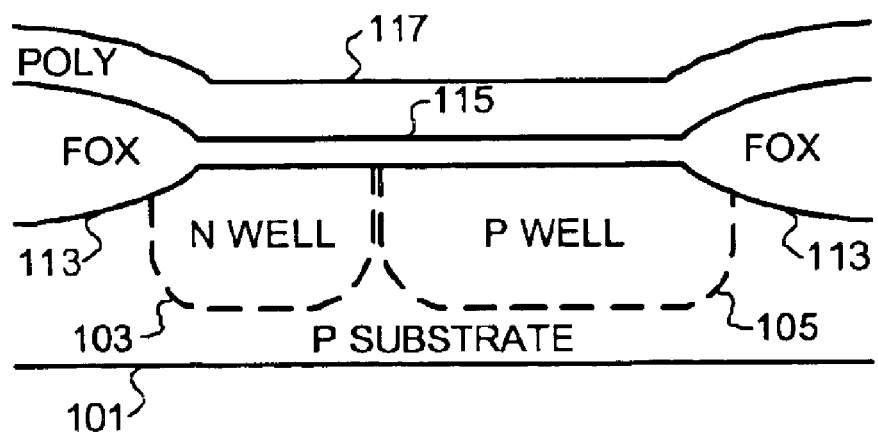
FIG. 4 shows the addition of the field oxide regions and a poly layer.

As illustrated in FIG. 4, field oxide regions 113 are formed in the substrate 101 using any suitable conventional semiconductor processing method, such as LOCOS. The field oxide regions 113 define an active area in which the photodiode is formed. Also formed on top of the substrate 101 between the field oxide regions 113 is an isolation oxide 115. The isolation oxide 115 is also referred to as a gate oxide and is preferably formed from silicon dioxide. The method that is used to form the silicon dioxide isolation oxide layer 115 can be one of any well-known techniques, including the thermal oxidation of silicon. As also shown in FIG. 4, a layer of polysilicon 117 is deposited over the gate oxide 115. The polysilicon may be deposited using any conventional technique, such as low-pressure chemical vapor deposition (LPCVD).

Figure 5:
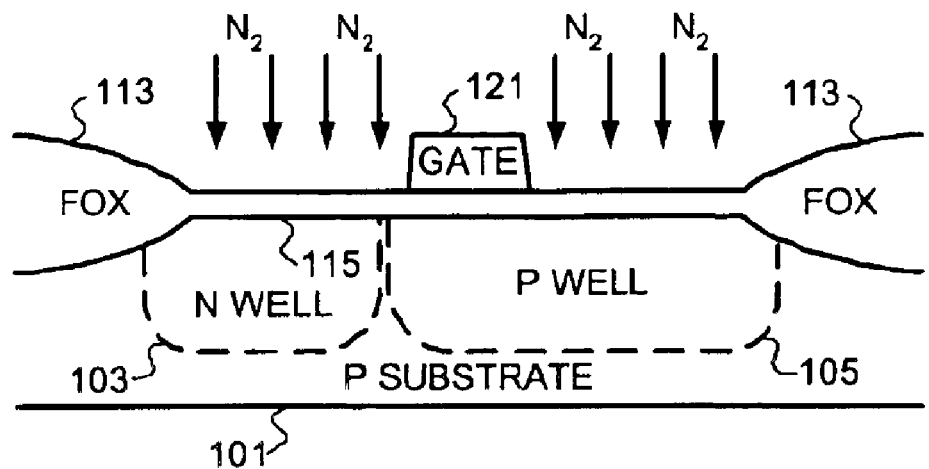
FIG. 5 shows the formation of a gate from the poly layer and the passivation of the silicon substrate.

As illustrated in FIG. 5, the polysilicon layer 117 is patterned and etched using conventional photolithography and masking techniques to form a control gate 121. As described below, this will be the gate 121 for the reset transistor.

Still referring to FIG. 5, a doping step is performed. This doping step in one embodiment is an ion implantation of nitrogen ($N_2$). By implanting nitrogen into the silicon substrate 101 (and particularly the N-well 103), the dangling silicon bonds may be passivated. It should be noted that the ion implantation process may be done after the gate 121 has been formed, or alternatively, the ion implantation may be performed before the gate oxide (isolation oxide 115) has been formed. In one embodiment, the implant is performed at a power of 5–20 KeV and to a dosage of 1×E14 to 1×E16/cm$^2$ and to a depth of 100–500 angstroms.

Because the ion implantation of nitrogen technique may damage the structures, in one embodiment, after the ion implantation, a conventional anneal process is performed to repair the damage. The end result is that the nitrogen implant provides a nitrogen-passivated surface of the substrate 101. It can be appreciated that the photodiode that is formed is a N-well/P-sub type of photodiode, but other types of photodiodes may also be used. The important consideration is that the surface of the photodiode (whatever doped material is on the surface) is passivated.

In another embodiment, the doping step is performed by thermal diffusion of nitrogen into the substrate. The goal and result is the same as with the ion implantation: to passivate the dangling silicon bonds with nitrogen. In one embodiment, the thermal diffusion is performed at 850–950 degrees C. for about twenty minutes or more. Further, the thermal diffusion is optimally applied after the polysilicon gate 121 is patterned and etched, since it is difficult to diffuse nitrogen through polysilicon and gate oxide to the desired photodiode surface to passivate the dangling silicon bonds.

While the above description has used nitrogen as an example, any element that can passivate the dangling silicon bond may also be used. For example, oxygen or hydrogen may be used. Still alternatively, silicon may also be used, as well as any element that has strong bonding with the silicon substrate. Furthermore, the above describes thermal diffusion or ion implantation as techniques for doping. However, it can be appreciated that other types of doping may be used, such as low damage plasma doping.

In accordance with another aspect of the present invention, it has been found that by replacing the isolation oxide 115, which is typically formed from thermal silicon oxide ($SiO_2$), with a silicon oxynitride ($SiO_xN_y$), a similar passivating effect is found. Thus, in FIG. 4, instead of forming an isolation oxide 115, a silicon oxynitride layer is formed between the field oxide 113. The formation of silicon oxynitride is well known in the art and can be done using conventional chemical vapor deposition techniques. The use of silicon oxynitride, relative to silicon dioxide, provides fewer interface traps and replaces weak bonds near the Si—$SiO_2$ interface with stronger Si—N bonds. Thus, dark current can be reduced by using silicon oxynitride as the gate dielectric. Still alternatively, a $N_2O$-nitrided oxide has similar advantage to that of silicon oxynitride.

Figure 6:
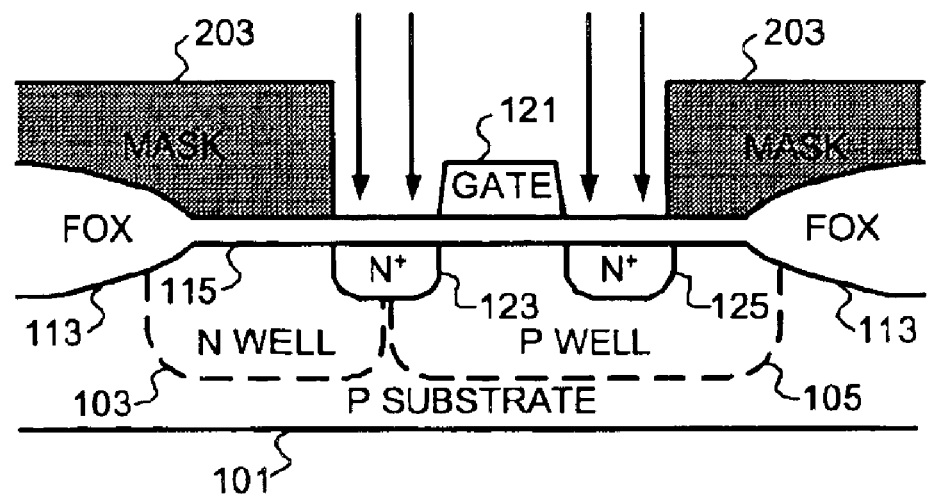
FIG. 6 shows the formation of N+ regions on either side of the gate.

Continuing with the description, as illustrated in FIG. 6, a photolithography mask 203 is deposited. The mask 203 is formed using conventional lithography techniques. Thereafter, high concentration doping is used to form N+ regions using the mask 203 as an implementation mask. The implementation of the high concentration doping is performed using known techniques in the prior art and conventional dopants. This forms an N+ region 123 and an N+ region 125. Note that the N+ region 123 is formed at the border between the N-well 103 and the P-well 105. As will be described in more detail below, the N+ regions 123 and 125 will be used as the source and drain of the reset transistor.

Figure 7:
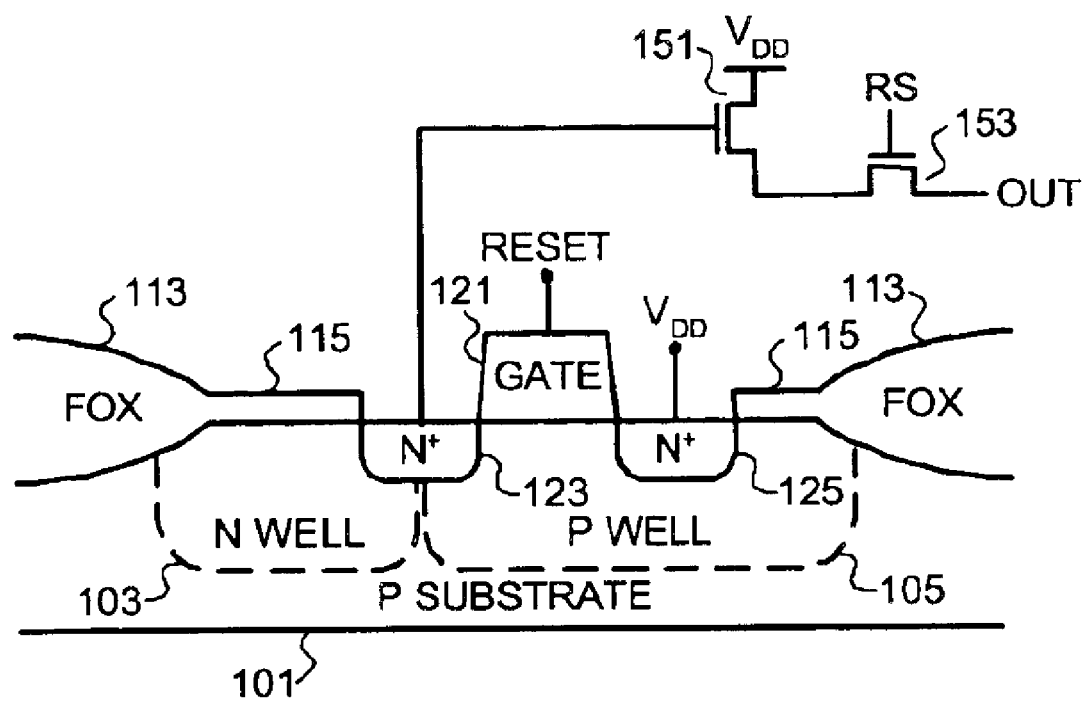
FIG. 7 shows a partial circuit diagram illustrating the connections of a completed active pixel sensor device with a three-transistor structure.

As seen in FIG. 7, the N+ region 123 is connected to output circuitry. The output circuitry includes a buffer transistor 151, in addition to a row select transistor 153. The N+ region 123 is coupled to the gate of the buffer transistor 151, while the drain of the buffer transistor 151 is coupled to a fixed voltage such as VDD. The source of the transistor 151 is coupled to the drain of the row select transistor 153, while the source of the transistor 153 provides the output of the processing circuitry. The gate of the row select transistor 153 receives a row select signal RS.

As also illustrated in FIG. 7, the N+ region 125 is connected to a fixed voltage such as the supply voltage VDD. The reset gate 121 is periodically activated by a reset signal. When the reset signal is "on," the channel under the reset gate 121 is made conducting, and current is able to flow through the transistor so as to reset the photodiode.

As illustrated, the present invention provides an active pixel photodiode structure that can be formed with the standard CMOS process. In addition, the device of FIG. 7 is formed with only three transistors, as compared to the four transistors required for the previously described pinned photodiodes. As a result, for a given fabrication area, the present device can devote more area to photosensing rather than the processing circuitry. In addition, this avoids the image lag that can sometimes result in pinned photodiodes due to an incomplete transfer of charge from the diode to the floating node, in cases when the junction profile is not perfectly optimized for the charge transfer.

The described structure of the present invention provides for a deep junction photodiode, as seen in the deep N-well/P-sub junction (as seen between the N-well 103 and the P-substrate 101), thereby providing for high sensitivity of the device. In addition, dark current is reduced in that a nitrogen (or other element) dopant passivates the silicon surface.

While the preferred embodiment of the invention has been illustrated and described, it will be appreciated that various changed can be made therein without departing from the spirit and scope of the invention. For example, while the formation of the active pixel sensor illustrated in FIGS. 2 and 3 has generally shown the N-well 103 being formed before the P-well 105, these processes could be performed in the reverse order. In addition, while the formation of the field oxide regions 113 in FIG. 4 was generally illustrated as being formed after the N-well 103 and P-well 105, the N-well and/or P-well could be formed after the formation of the field oxide regions 113. It is also understood where the device has generally been shown using different types of P or N type materials, the types of materials could be switched to produce similar results. For example, rather than the N-well/P-sub photodiode that was formed, the alternate types of materials could be used to form a P-well/N-sub photodiode. Thus, the passivation techniques can also be used with photodiodes that are N+/P-well, N+/P-sub, N-well/P-sub, P+/N-well, P-well/N-sub, etc. . . . Thus, the term PN photodiode is defined to include all types of photodiodes.

In addition, the above-described photodiode could also be used in other applications. For example, rather than an active pixel sensor, the photodiode could be implemented in a passive pixel sensor. Also, rather than being implemented in a three transistor active pixel sensor, other styles of active pixel sensors could be used, such as a two transistor, a four transistor, or a log scale implementation. As previously noted, some examples of general prior art design approaches to these other styles are shown in U.S. Pat. Nos. 5,587,596, 5,926,214, and 5,933,190.

The present invention has thus been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the letters patent granted hereon be limited only by the definitions contained in appended claims and equivalents thereof, and not by limitations of the embodiments described herein.

We claim:

1. A pixel for use in a CMOS imaging array, said pixel having a PN photodiode comprising:
   a semiconductor substrate having a first conductivity type; and
   a well of a second conductivity type formed in the semiconductor substrate, the surface of said first well being passivated by a nitrogen dopant, wherein said nitrogen dopant extends down from said surface by about 100–500 angstroms.

2. The pixel of claim 1, wherein said nitrogen dopant has a concentration of about $1 \times E14$ to $1 \times E16/cm^2$.

3. The pixel of claim 1, further including a silicon oxide layer over said first well.

4. The pixel of claim 1, further including a silicon oxynitride layer over said first well.

5. The pixel of claim 1, wherein said nitrogen dopant is introduced using ion implantation.

6. The pixel of claim 1, wherein said nitrogen dopant is introduced using a thermal diffusion.

7. A pixel for use in a CMOS image sensor comprising:
   a PN photodiode, the surface of said PN photodiode being passivated with a nitrogen dopant implant, wherein said nitrogen dopant extends down from said surface by about 100–500 angstroms.
   a reset transistor coupled to the photodiode for resetting the signal level on the photodiode;
   a buffer transistor, the gate of the buffer transistor being coupled to the output of the photodiode; and
   a row select transistor, the gate of the row select transistor being coupled to a row select signal line, the input of the row select transistor being coupled to the output of the buffer transistor, and the output of the row select transistor providing the output of the pixel sensor cell.

8. The pixel of claim 7, wherein said nitrogen dopant is replaced with an oxygen or silicon dopant.

9. The pixel of claim 7, wherein said nitrogen dopant has a concentration of about $1 \times E14$ to $1 \times E16/cm^2$.

10. The pixel of claim 7, further including a silicon oxide layer over said first well.

11. The pixel of claim 7, further including a silicon oxynitride layer over said first well.

* * * * *